United States Patent
Park et al.

(10) Patent No.: US 8,148,193 B2
(45) Date of Patent: Apr. 3, 2012

(54) SEMICONDUCTOR DEVICE AND METHOD OF FABRICATING THE SAME

(75) Inventors: Jae-Hyun Park, Gyeonggi-do (KR); Jae-Hee Oh, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/236,941

(22) Filed: Sep. 20, 2011

(65) Prior Publication Data

US 2012/0009755 A1    Jan. 12, 2012

Related U.S. Application Data (62) Division of application No. 11/864,046, filed on Sep. 28, 2007, now Pat. No. 8,039,828.

(30) Foreign Application Priority Data

Sep. 29, 2006  (KR) .................................. 2006-95915

(51) Int. Cl.
*H01L 21/00*    (2006.01)
(52) U.S. Cl. .... 438/95; 438/381; 438/385; 257/E21.364
(58) Field of Classification Search ................... 438/95, 438/381, 385; 257/E21.364
See application file for complete search history.

(56) References Cited

U.S. PATENT DOCUMENTS

| | | | |
|---|---|---|---|
| 6,501,111 | B1 | 12/2002 | Lowrey |
| 6,744,088 | B1 | 6/2004 | Dennison |
| 2002/0070379 | A1 | 6/2002 | Dennison |
| 2004/0113137 | A1 | 6/2004 | Lowrey |
| 2004/0234895 | A1 | 11/2004 | Lee |
| 2006/0186483 | A1 | 8/2006 | Cho |
| 2006/0278921 | A1 | 12/2006 | Pellizzer |

FOREIGN PATENT DOCUMENTS

KR    10-2006-0000845    1/2006

*Primary Examiner* — Samuel Gebremariam
(74) *Attorney, Agent, or Firm* — Myers Bigel Sibley & Sajovec, P.A.

(57) ABSTRACT

A semiconductor device such as a phase change memory device includes a semiconductor substrate including an active region, a conductive pattern disposed to expose the active region, an interlayer dielectric pattern provided on the conductive pattern and including an opening formed on the exposed active region and a contact hole spaced apart from the opening to expose the conductive pattern, a semiconductor pattern and a heater electrode pattern electrically connected to the exposed active region and provided in the opening, a contact plug connected to the exposed conductive pattern and provided to fill the contact hole, and a phase change material layer provided on the heater electrode pattern.

12 Claims, 9 Drawing Sheets

SEMICONDUCTOR DEVICE AND METHOD OF FABRICATING THE SAME

CROSS-REFERENCE TO RELATED APPLICATIONS

This patent application is a divisional of U.S. patent application Ser. No. 11/864,046, filed on Sep. 28, 2007 now U.S. Pat. No. 8,039,828, which claims the benefit of foreign priority under 35 U.S.C. §119 to Korean Patent Application No. 10-2006-0095915, filed on Sep. 29, 2006, the contents of which are herein incorporated by reference in their entireties.

BACKGROUND

Embodiments of the present invention relates to semiconductor devices and methods of fabricating the same. More specifically, embodiments of the present invention are directed to a semiconductor device such as a phase change memory device and a method of fabricating the same.

With the advance in electronic industries such as mobile communications or computers, there is a requirement for semiconductor memory devices to have characteristics such as a high read/write speed, non-volatility, a lower operating voltage. However, recently developed memory devices (e.g., SRAM devices, DRAM devices or flash memory devices) do not meet these characteristics.

For example, a unit cell of a DRAM device includes one capacitor and one transistor configured to control the capacitor. Accordingly, the DRAM device has a larger unit cell area than a NAND flash memory device. Further, because the DRAM device includes the capacitor in which data is stored, it is a kind of volatile memory device that requires a refresh operation. While an SRAM device has a high operation speed, it is also a kind of volatile memory device. Because a unit cell of the SRAM device includes six transistors, the SRAM device has a considerably large unit cell area. While a flash memory device is a kind of non-volatile memory device and provides the highest integration density (especially, in case of a NAND flash memory device), it is well known that the flash memory device has a low operation speed.

Accordingly, memory devices having a high read/write speed, which are non-volatile, which do not require refresh operations, and which have a low operation voltage are being studied. A phase change random access memory (PRAM) is becoming attractive as one of the next generation memory devices capable of meeting the above-mentioned requirements. For example, because a PRAM device can rewrite data $10^{13}$ times or more, it has advantages as follows: (1) long lifespan; and (2) higher operation speed than 30 nanoseconds.

The data stored in a memory cell of a PRAM may be read out by sensing the resistance change caused by change of a crystalline state of a phase change material layer. The crystalline state of the phase change material layer is dependent on heating temperature and heating time of the phase change material layer. In the PRAM, a state of the phase change material layer is changed to a desired state by controlling current flowing at the phase change material layer and Joule's heat generated by the current. As well known, the Joule's heat (Q) may be given by Joule's Law.

$$Q \propto I^2 R t \qquad \text{Equation 1}$$

Resistance (R) is a fixed parameter that is dependent on a kind of material or fabricating process, whereas time (t) and current (I) are parameters for the operation of products and externally controllable parameters. Thus, resistance of a portion where the phase change material layer is heated is necessarily increased to heat the phase change material layer up to a required temperature while minimizing power dissipation.

From a standpoint of a semiconductor memory device including a phase change random access memory, an increase in operation current ($I_{on}$) is required to achieve a high integration and a high speed operation. Resistance elements having an effect on the operation current of the semiconductor memory device are metal resistance, contact resistance, and active region resistance. These resistance elements decrease the operation current of the semiconductor memory device to degrade operation characteristics of the semiconductor memory device.

SUMMARY

Embodiments exemplarily described herein are directed to semiconductor device such as a phase change memory device and a method of fabricating the same.

One exemplary embodiment can be characterized as a semiconductor device that includes a semiconductor substrate having an active region; a conductive pattern disposed on the semiconductor substrate, wherein a predetermined region of the active region is exposed by the conductive pattern; an interlayer dielectric pattern provided on the conductive pattern, the interlayer dielectric pattern including an opening and a contact hole spaced apart from the opening, wherein the opening exposes the predetermined region of the active region and the contact hole exposes the conductive pattern; a semiconductor pattern provided in the opening and electrically connected to the exposed active region; a heater electrode pattern provided in the opening and electrically connected to the semiconductor pattern; a contact plug substantially filling the contact hole and connected to the conductive pattern; and a phase change material layer provided on the heater electrode pattern.

Another exemplary embodiment can be characterized as a method of forming a semiconductor device that includes forming an active region in a semiconductor substrate; forming a conductive pattern exposing a predetermined region of the active region; forming an interlayer dielectric pattern on the conductive pattern, the interlayer dielectric pattern including an opening that exposes the predetermined region of the active region; forming a semiconductor pattern in the opening; forming a heater electrode pattern on the semiconductor pattern and in the opening; forming a contact hole spaced apart from the opening, wherein the contact hole exposes the conductive pattern; forming a contact plug to substantially fill the contact hole; and forming a phase change material layer on the heater electrode pattern.

DETAILED DESCRIPTION

Embodiments of the present invention will now be described more fully hereinafter with reference to the accompanying drawings. These embodiments, however, may be realized in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like numbers refer to like elements throughout.

FIGS. 1A through 1J are cross-sectional views illustrating an exemplary method of fabricating a semiconductor device, such as a phase change memory device, according to one embodiment.

Figure 1A:
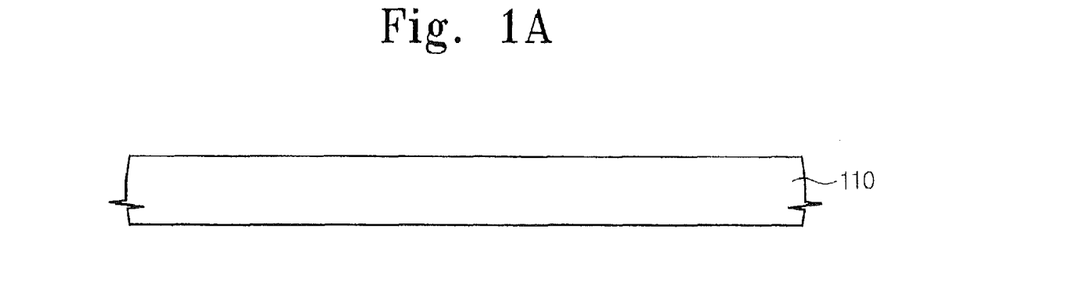
FIGS. 1A through 1J are cross-sectional views illustrating an exemplary method of fabricating a semiconductor device according to one embodiment.

Referring to FIG. 1A, a device isolation layer (not shown) is formed to define an active region in a semiconductor substrate 110. The active region may function as a lower conductive region of a semiconductor device. Accordingly, the active region may be used as an interconnection (e.g., a wordline) formed to connect phase change random access memory cells in a predetermined direction. When functioning as an interconnection, the active region may receive a power through a contact plug formed in a subsequent process. The active region may include an impurity region that is heavily doped with impurities having a different conductivity type from the semiconductor substrate 110. For example, where the conductivity type of the semiconductor substrate 110 is P-type, the active region may include $N^+$-type impurity region.

Figure 1B:
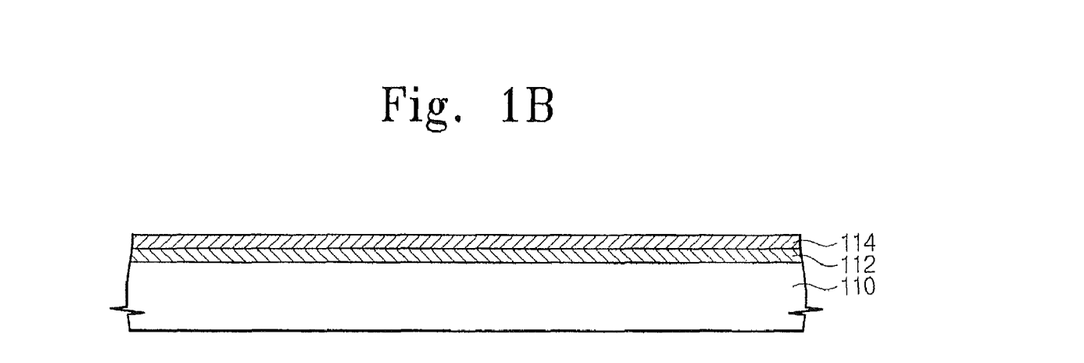

Referring to FIG. 1B, a metal layer 112 and a reaction barrier layer 114 are formed to cover the semiconductor substrate 110 in which the active region is defined. In one embodiment, the metal layer 112 may be formed to facilitate the forming of a metal silicide layer on the active region of the semiconductor substrate 110. Thus, the metal layer 112 may include a silicidable material such as cobalt (Co), or the like. The reaction barrier layer 114 may substantially prevent the metal layer 112 from being oxidized by an external environment. In one embodiment, the reaction barrier layer 114 may include a material such as, titanium nitride (TiN), or the like.

Figure 1C:
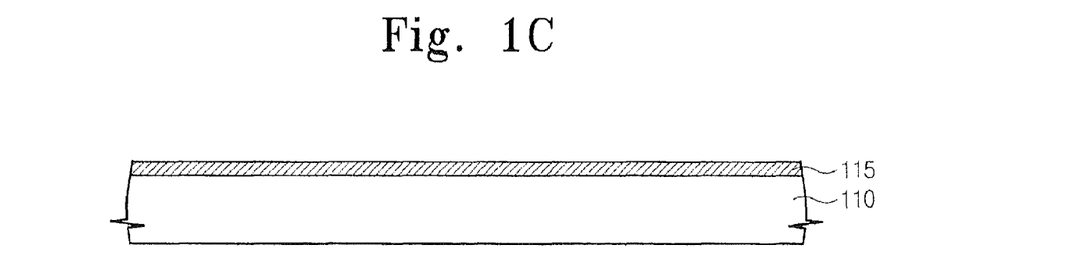

Referring to FIG. 1C, the active region of the semiconductor substrate 110 is reacted with the metal layer 112 to form a conductive layer 115 that is a metal silicide layer. In one embodiment, the conductive layer 115 may include cobalt silicide (CoSi). The reaction barrier layer 114 and unreacted portions of the metal layer 112 are then removed by means of a strip process. The strip process may include, for example, a wet etch process. Thus, a conductive layer 115 may be formed to cover the active region of the semiconductor substrate 110.

Figure 1D:
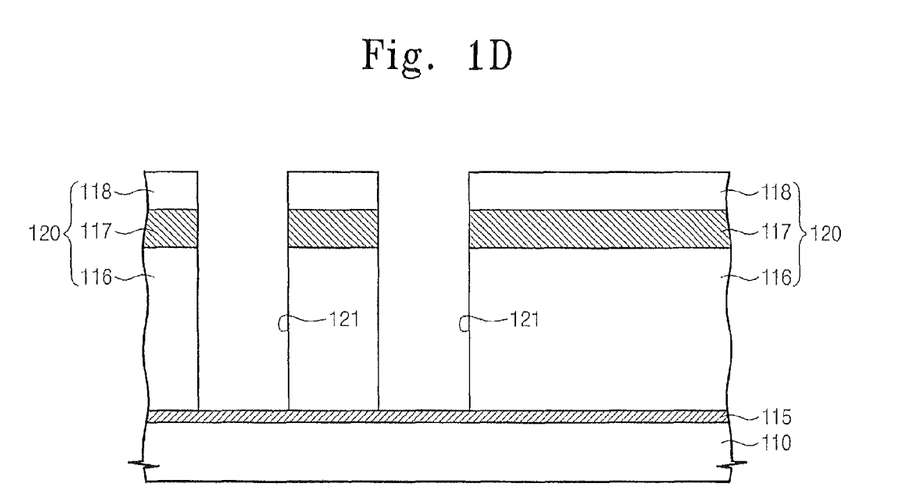

Referring to FIG. 1D, an interlayer dielectric layer is formed on the conductive layer 115. The interlayer dielectric layer is patterned to form an interlayer dielectric pattern 120, which includes an opening 121 formed to expose a predetermined region of the conductive layer 115. The interlayer dielectric layer may include a material such as silicon oxide ($SiO_2$), silicon nitride (SiN), silicon oxynitride (SiON), a low-k dielectric material, or the like or a combination thereof. The interlayer dielectric pattern 120 may be a single layer of silicon oxide or a triple layer of silicon oxide-silicon nitride-silicon oxide. In the illustrated embodiment, the interlayer dielectric layer is a triple layer comprising a first silicon oxide layer 116, a silicon nitride layer 117, and a second silicon oxide layer 118 that are stacked in the order listed.

The opening 121 may be formed by forming a mask pattern (not shown) on the interlayer dielectric layer and anisotropically etching the interlayer dielectric layer using the mask pattern as an etch mask. After anisotropically etching the interlayer dielectric layer, a portion of the conductive layer 115 is exposed by the opening 121. The anisotropic etch is performed with an etch selectivity to the active region of the semiconductor substrate 110.

Figure 1E:
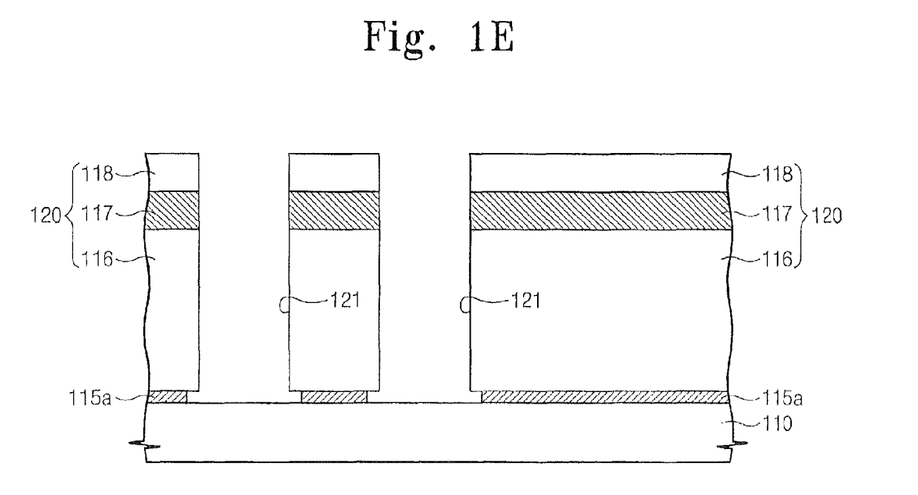

Referring to FIG. 1E, the conductive layer 115 exposed by the opening 121 is removed to form a conductive pattern 115a. Thus, a predetermined region of the active region of the semiconductor substrate 110 may be exposed. The exposed conductive layer 115 may be removed using a wet etch process using hydrofluoric acid (HF) as an etch solution. During the removal of the exposed conductive layer 115, a lower portion of the opening 121 may extend underneath the interlayer dielectric pattern 120. That is, the opening 121 may include an undercut portion below the interlayer dielectric pattern 120.

Figure 1F:
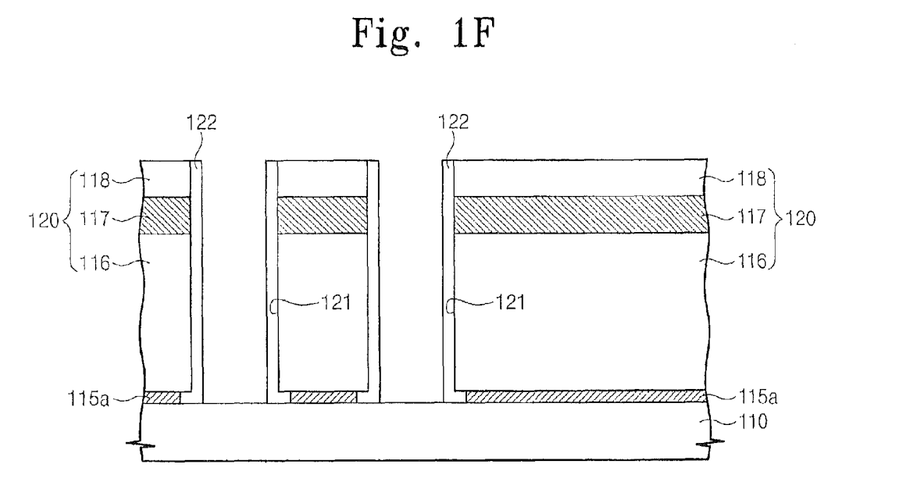

Referring to FIG. 1F, a spacer 122 is formed on an inner sidewall of the opening 121 to expose the predetermined region of the active region of the semiconductor substrate 110. The spacer 122 substantially fills the undercut portion formed during the removal of the exposed conductive layer 115 to improve a reliability of a subsequently formed semiconductor device (e.g., a phase change memory device). The formation of the spacer 122 may be omitted in embodiments where a semiconductor layer such as polysilicon is formed in a subsequent process. The spacer 122 may include a material such as, for example, silicon oxide.

Figure 1G:
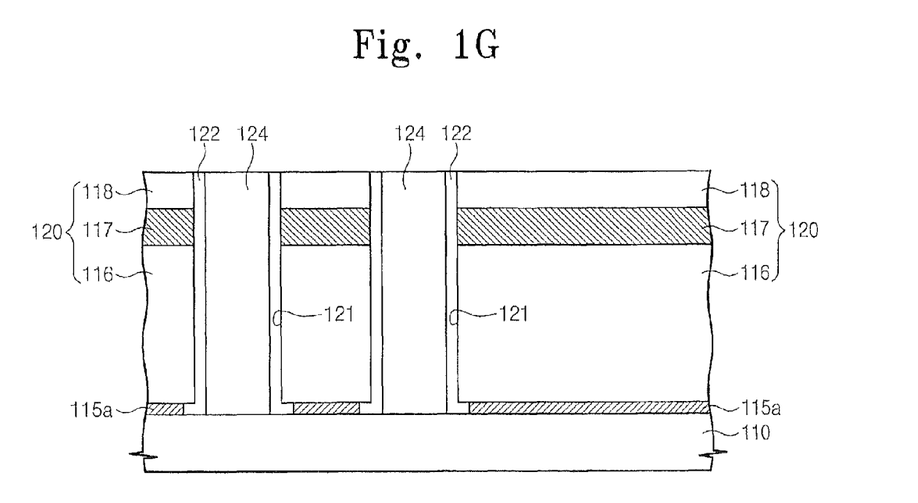

Referring to FIG. 1G, a semiconductor layer 124 is formed to substantially fill the opening 121 having the inner sidewall on which the spacer 122 is formed. The semiconductor layer 124 may be formed by, for example, forming a semiconductor material layer covering the interlayer dielectric pattern 120 and filling the opening 121 followed by patterning the semiconductor material layer. In one embodiment, the semiconductor material layer may be patterned by planarized using a polishing process such as a chemical mechanical polishing (CMP) process. The semiconductor layer 124 may include a selective epitaxial growth (SEG) layer, a polysilicon layer, or the like or a combination thereof.

In one embodiment, an SEG layer may be formed by means of an epitaxial process using the predetermined region of the active region exposed by the opening 121 as a seed layer and may include a material including one or more Group IV elements, one or more Group III-V elements, or the like or a combination thereof. For example, the semiconductor layer 124 may be an epitaxial germanium-silicon layer or an epitaxial silicon layer. In one embodiment, a polysilicon layer may be formed using, for example, a chemical vapor deposition (CVD) process. In one embodiment, the semiconductor layer 124 may be a selective epitaxial silicon layer.

Figure 1H:
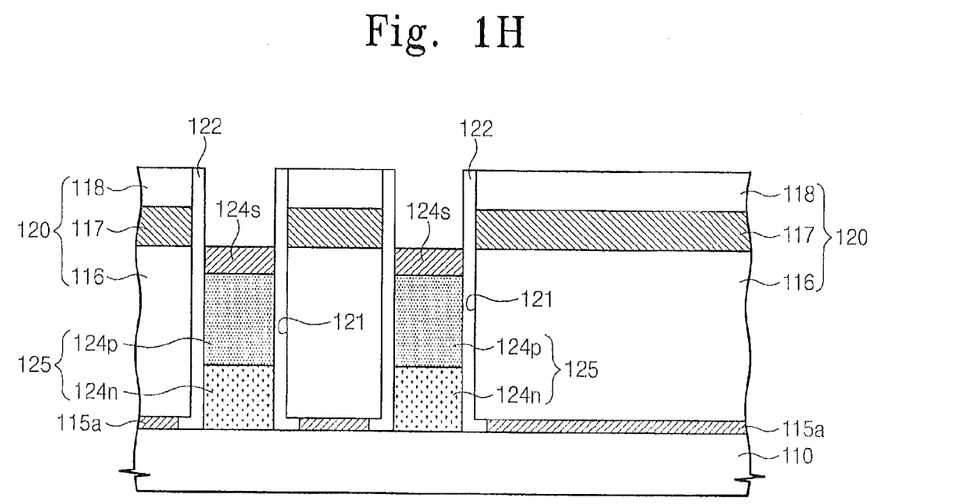

Referring to FIG. 1H, the semiconductor layer 124 is recessed to form a recessed semiconductor layer (not shown) filling only a lower portion of the opening 121. The semiconductor layer 124 may be recessed by, for example, etching the semiconductor layer 124 using an etch-back process until an upper sidewall of the opening 121 is exposed. According to one embodiment, the height of a subsequently formed heater electrode is determined by the height of the upper sidewall of the opening 121 that is exposed as a result of the recess process. That is, the height of a subsequently formed heater electrode is determined by the height of the recessed semiconductor layer present within the lower portion of the opening 121 after the recess process.

Impurity ions are implanted into the recessed semiconductor layer filling the lower portion of the opening 121, thereby forming a semiconductor pattern. The semiconductor pattern may include a diode 125 comprising a lower impurity region 124n and an upper impurity region 124p. In one embodiment, the lower impurity region 124n may be an N-type impurity region and the upper impurity region 124p may be a P-type impurity region.

The semiconductor pattern may further include a metal silicide layer 124s formed on the diode 125. The metal silicide layer 124s may lower a resistance at the boundary between the diode 125 and a subsequently formed heater electrode, thereby decreasing an operation current of the semiconductor device. In one embodiment, the metal silicide layer 124s is formed by depositing a metal layer having a high melting-point and reacting the recessed semiconductor layer with the metal layer during a siliciding process. Any unreacted portion of the metal layer during the siliciding process may be removed in a strip process. The strip process may include, for example, a wet etch process. The metal silicide layer 124s may include a material such as, for example, cobalt silicide, tungsten silicide ($WSi_x$), or the like or a combination thereof. In one embodiment, the metal silicide layer 124s may be formed of cobalt silicide.

Figure 1I:
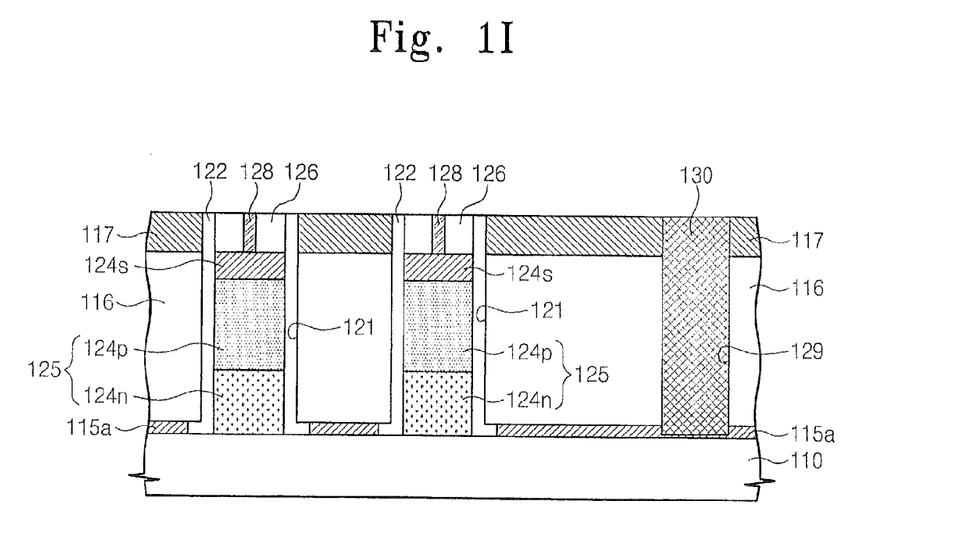

Referring to FIG. 1I, a heater electrode pattern is formed to substantially fill the opening 121 on the semiconductor pattern. The heater electrode pattern may include a heater electrode 128 and a heater electrode spacer 126 surrounding the heater electrode 128. The heater electrode spacer 126 may be formed by depositing a thermally insulative material layer within the opening 121 and on the semiconductor pattern. The thermally insulative material layer may then be anisotropically etched in a dry etch process. The heater electrode 128 may be formed by depositing a heater electrode material to substantially fill the opening 121 where the heater electrode spacer 126. A patterning process may then be performed to form the heater electrode 128 with a narrowed cross section. In one embodiment, the patterning process may include a planarization process performed by means of a polishing process such as a CMP process. By forming the heater electrode 128 with a narrowed cross section, the resistance of the heater electrode 128 may be increased. During the planarization process for forming the heater electrode 128, the second silicon oxide layer 118 may be removed.

As exemplarily shown in FIG. 1I, the heater electrode 128 is connected to the diode 125 and serves to heat a phase change material layer formed in a subsequent process. The heater electrode 128 may include, for example, a metal nitride, a metal oxynitride, carbon (C), titanium (Ti), zirconium (Zr), tantalum (Ta), copper (Cu), tungsten (W), hafnium (Hf), molybdenum (Mo), aluminum (Al), aluminum titanium (AlTi), aluminum-copper alloy (Al—Cu), aluminum-copper-silicon ally (Al—Cu—Si), tungsten titanium (WTi), tungsten silicide ($WSi_x$), or the like, or combinations thereof. The metal nitride may include, for example, titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), zirconium aluminum nitride (ZrAlN), tantalum silicon nitride (TaSiN), tantalum aluminum nitride (TaAlN), tungsten silicon nitride (WSiN), tungsten boron nitride (WBN), molybdenum silicon nitride (MoSiN), molybdenum aluminum nitride (MoAlN), or the like or a combination thereof. The metal oxynitride may include, for example, titanium oxynitride (TiON), titanium aluminum oxynitride (TiAlON), tantalum oxynitride (TaON), tungsten oxynitride (WON), or the like or a combination thereof. In one embodiment, the heater electrode 128 may be formed of titanium nitride.

The heater electrode spacer 126 may serve to narrow the cross sectional area of the heater electrode 128 as well as reduce the conduction of heat generated from the heater electrode 128. The heater electrode spacer 126 may include, for example, silicon oxide, silicon nitride, or the like or a combination thereof. In one embodiment, the heater electrode spacer 126 may be formed of the silicon nitride.

A contact hole 129 may be formed to be spaced apart from the opening 121 and to expose a portion of the conductive pattern 115a. A contact plug 130 is then formed to substantially fill the contact hole 129. The contact plug 130 may supply power to an interconnection formed to connect phase change random access memory cells in a predetermined direction. Accordingly, the interconnection may be a wordline connecting phase change random access memory cells, previously described with reference to FIG. 1A. Accordingly, the contact plug 130 may have resistance which is about 10 times lower than in a structure that is directly connected to an active region of the semiconductor substrate 110.

Figure 1J:
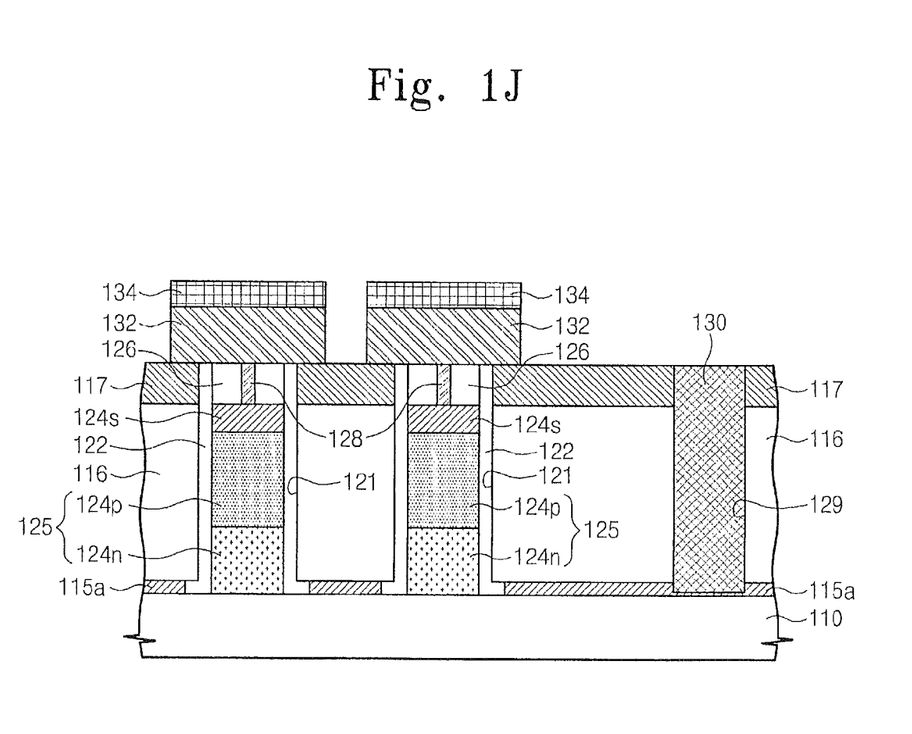

Referring to FIG. 1J, a phase change material layer 132 and a capping electrode 134 are sequentially formed on the resultant structure where the heater electrode 128 is formed. The phase change material layer 132 and the capping electrode 134 may be formed by depositing a phase change material and a capping electrode material and patterning the same.

The phase change material layer 132 may include a chalcogenide compound containing, for example, antimony (Sb), tellurium (Te), selenium (Se), or the like or a combination thereof. In one embodiment, the phase change material layer 132 may be formed of $Ge_{22}Sb_{22}Te_{56}$.

The capping electrode 134 may, for example, include a metal nitride, a metal oxynitride, carbon (C), titanium (Ti), zirconium (Zr), tantalum (Ta), copper (Cu), tungsten (W), hafnium (Hf), molybdenum (Mo), aluminum (Al), aluminum titanium (AlTi), aluminum-copper alloy (Al—Cu), aluminum-copper-silicon ally (Al—Cu—Si), tungsten titanium (WTi), tungsten silicide ($WSi_x$), or the like or a combination thereof. The metal nitride may, for example, titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), zirconium aluminum nitride (ZrAlN), tantalum silicon nitride (TaSiN), tantalum aluminum nitride (TaAlN), tungsten silicon nitride (WSiN), tungsten boron nitride (WBN), molybdenum silicon nitride (MoSiN), molybdenum aluminum nitride (MoAlN), or the like or a combination thereof. The metal oxynitride may, for example, include titanium oxynitride (TiON), titanium aluminum oxynitride (TiAlON), tantalum oxynitride (TaON), tungsten oxynitride (WON), or the like or a combination thereof. In one embodiment, the capping electrode 134 may be formed of titanium nitride. A bitline (not shown) may be formed over the capping electrode 134.

FIGS. 2A through 2J are cross-sectional views illustrating an exemplary method of fabricating a semiconductor device, such as a phase change memory device, according to another embodiment.

Figure 2A:
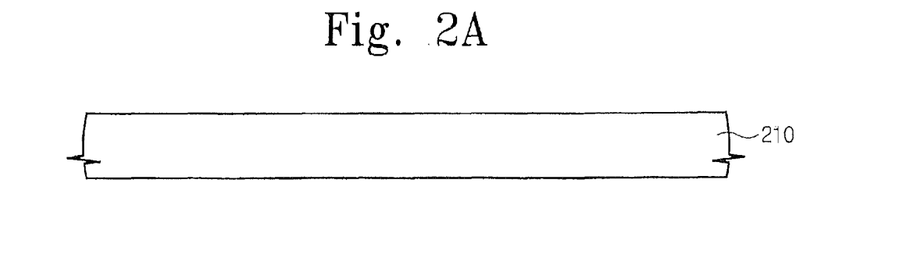
FIGS. 2A through 2J are cross-sectional views illustrating an exemplary method of fabricating a semiconductor device according to another embodiment.

Referring to FIG. 2A, a device isolation layer (not shown) is formed to define an active region in a semiconductor substrate 210. The active region may function as a lower conductive region of a semiconductor device. Accordingly, the active region may be used as an interconnection (e.g., a wordline) formed to connect phase change random access memory cells in a predetermined direction. When functioning as an interconnection, the active region may receive a power through a contact plug formed in a subsequent process. The active region may include an impurity region that is heavily doped with impurities having a different conductivity type from the semiconductor substrate 210. For example, where the conductivity type of the semiconductor substrate 110 is P-type, the active region may include N+-type impurity region.

Figure 2B:
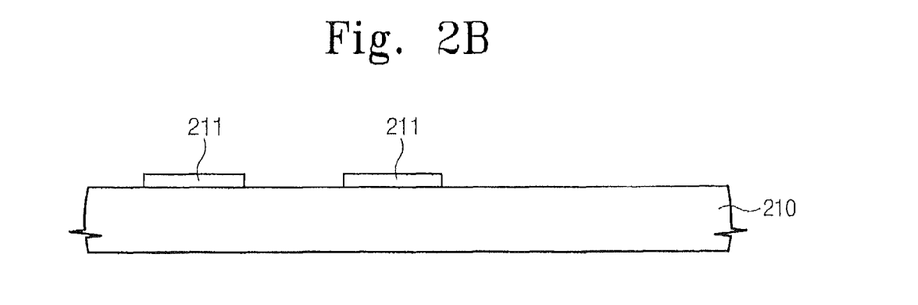

Referring to FIG. 2B, a silicide blocking pattern 211 is formed on the active region of the semiconductor substrate 210 to expose a portion of the semiconductor substrate 210. The silicide blocking pattern 211 may substantially prevent a subsequently formed metal layer from reacting with the semiconductor substrate 210 during a subsequent silicidation process performed to form a conductive pattern. The silicide blocking pattern 211 may include silicon oxide, silicon nitride, silicon oxynitride, a low-k dielectric material, or the like or a combination thereof. In one embodiment, the silicon blocking pattern 211 may be formed of silicon nitride.

Figure 2C:
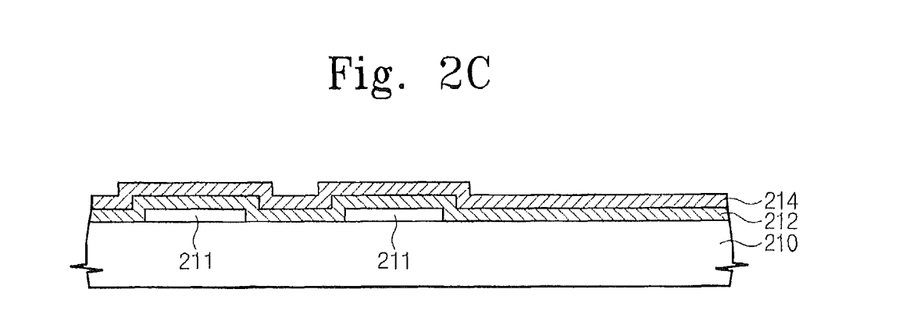

Referring to FIG. 2C, a metal layer 212 and a reaction barrier layer 214 are formed to cover the semiconductor substrate 210 where the silicide blocking pattern 211 is formed. Thus, the metal layer 212 may include a silicidable material such as cobalt (Co), or the like. The reaction barrier layer 214 may substantially prevent the metal layer 212 from being oxidized by an external environment. In one embodiment, the reaction barrier layer 214 may include a material such as, titanium nitride (TiN), or the like.

Figure 2D:
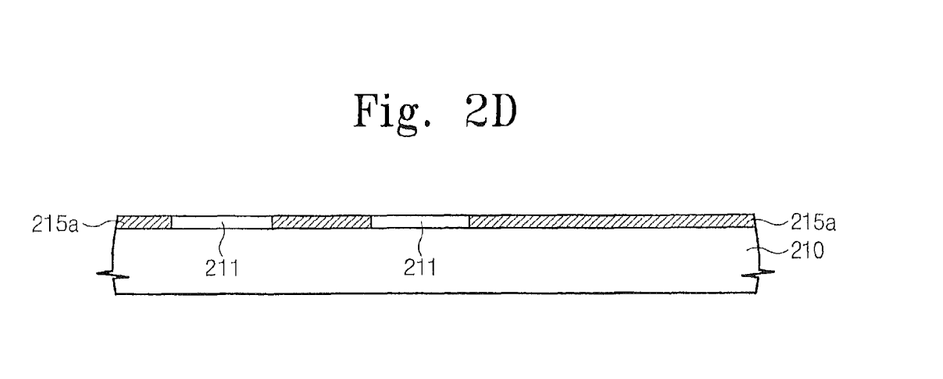

Referring to FIG. 2D, portions of the active region of the semiconductor substrate 210 exposed by the silicide blocking pattern 211 react with the metal layer 212 to form a conductive pattern 215a that is a metal silicide layer. In one embodiment, the conductive pattern 215a may include cobalt silicide (CoSi). The reaction barrier layer 214 and unreacted portions of the metal layer 212 are then removed by means of a strip process. The strip process may include, for example, a wet etch process. Thus, the silicide blocking pattern 211 and the conductive pattern 215a may be formed to cover the active region of the semiconductor substrate 210.

Figure 2E:
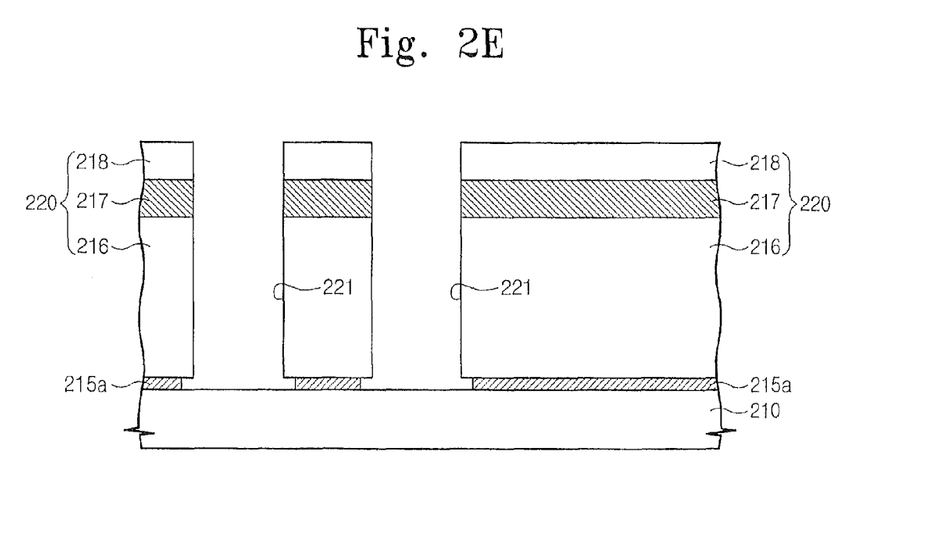

Referring to FIG. 2E, an interlayer dielectric layer is formed on the silicide blocking pattern 211 and the conductive pattern 215a. The interlayer dielectric layer is patterned to form an interlayer dielectric pattern 220, which includes an opening 221 formed to expose the silicide blocking pattern 211. The interlayer dielectric layer may include a material such as silicon oxide ($SiO_2$), silicon nitride (SiN), silicon oxynitride (SiON), a low-k dielectric material, or the like or a combination thereof. The interlayer dielectric pattern 220 may be a single layer of silicon oxide or a triple layer of silicon oxide-silicon nitride-silicon oxide. In the illustrated embodiment, the interlayer dielectric layer is a triple layer comprising a first silicon oxide layer 216, a silicon nitride layer 217, and a second silicon oxide layer 218 that are stacked in the order listed.

The opening 221 may be formed by forming a mask pattern (not shown) on the interlayer dielectric layer and anisotropically etching the interlayer dielectric layer using the mask pattern as an etch mask. After anisotropically etching the interlayer dielectric layer, the silicide blocking pattern 211 is exposed by the opening 221. The anisotropic etch is performed with an etch selectivity to the active region of the semiconductor substrate 210.

The silicide blocking pattern 211 exposed by the opening 221 is removed to expose a predetermined region of the active region of the semiconductor substrate 210. The exposed silicide blocking pattern 211 may be removed using a wet etch process using phosphoric acid ($H_3PO_4$) as an etch solution. In an embodiment where the where the silicide blocking pattern 211 is formed of silicon oxide, the silicide blocking pattern 211 may be removed during the formation of the interlayer dielectric pattern 220. Accordingly, the amount by which the conductive pattern 215a is removed during wet etching of the silicide blocking pattern 211 may be suppressed. During the removal of the silicide blocking pattern 211, a lower portion of the opening 221 may extend underneath the interlayer dielectric pattern 220. That is, the opening 221 may include an undercut portion may below the interlayer dielectric pattern 220.

Figure 2F:
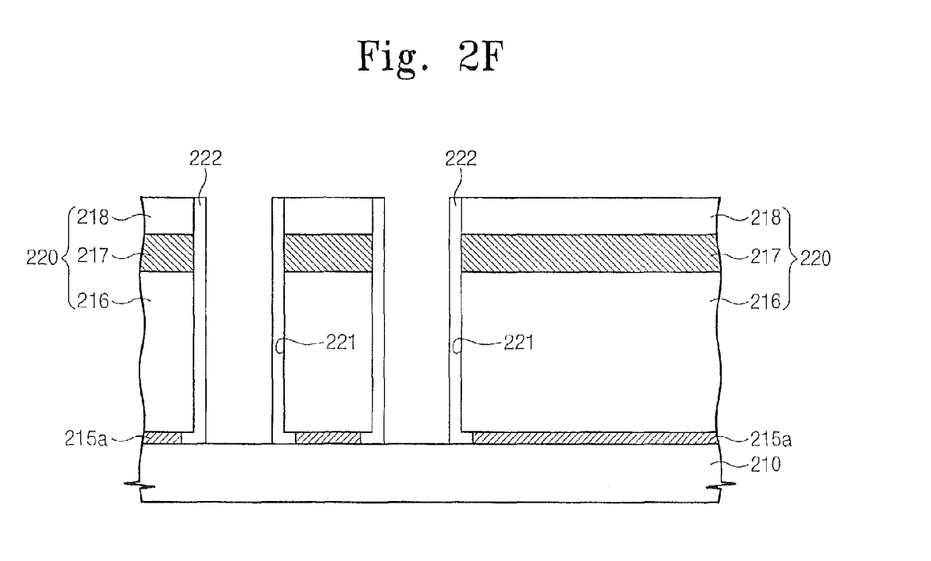

Referring to FIG. 2F, a spacer 222 is formed on an inner sidewall of the opening 221 to expose the predetermined region of the active region of the semiconductor substrate 210. The spacer 222 substantially fills the undercut portion formed during the removal of the silicide blocking pattern 211 to improve a reliability of a subsequently formed semiconductor device (e.g., phase change memory device). The formation of the spacer 222 may be omitted in the case where a semiconductor layer such as polysilicon is formed in a subsequent process. The spacer 222 may include a material such as, for example, silicon oxide.

Figure 2G:
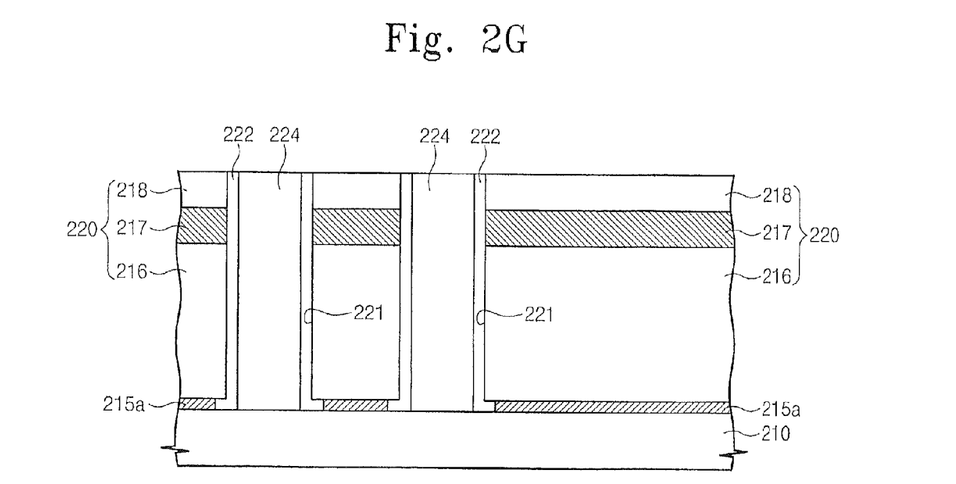

Referring to FIG. 2G, a semiconductor layer 224 is formed to substantially fill the opening 221 having the inner sidewall on which the spacer 222 is formed. The semiconductor layer 224 may be formed by, for example, forming a semiconductor material layer covering the interlayer dielectric pattern 220 and filling the opening 221 followed by patterning the semiconductor material layer. In one embodiment, the semiconductor material layer may be patterned by planarized using a polishing process such as a chemical mechanical polishing (CMP) process. The semiconductor layer 224 may include a selective epitaxial growth (SEG) layer, a polysilicon layer, or the like or a combination thereof.

In one embodiment, an SEG layer may be formed by means of an epitaxial process using the predetermined region of the active region exposed by the opening 221 as a seed layer and may include a material including one or more Group IV elements, one or more Group III-V elements, or the like or a combination thereof. For example, the semiconductor layer 224 may be an epitaxial germanium-silicon layer or an epitaxial silicon layer. In one embodiment, a polysilicon layer may be formed using, for example, a chemical vapor deposition (CVD) process. In one embodiment, the semiconductor layer 224 may be a selective epitaxial silicon layer.

Figure 2H:
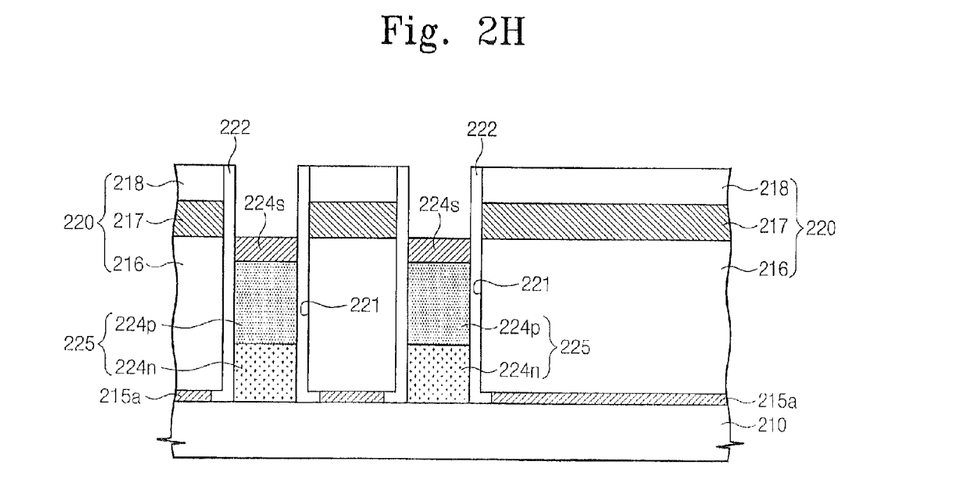

Referring to FIG. 2H, the semiconductor layer 224 is recessed to form a recessed semiconductor layer (not shown) filling only a lower portion of the opening 221. The semiconductor layer 224 may be recessed by, for example, etching the semiconductor layer 224 using an etch-back process until an upper sidewall of the opening 221 is exposed. According to one embodiment, the height of a subsequently formed heater electrode is determined by the height of the upper sidewall of the opening 221 that is exposed as a result of the recess process. That is, the height of a subsequently formed heater electrode is determined by the height of the recessed semiconductor layer present within the lower portion of the opening 221 after the recess process.

Impurity ions are implanted into the recessed semiconductor layer filling the lower portion of the opening 221, thereby forming a semiconductor pattern. The semiconductor pattern may include a diode 225 comprising a lower impurity region 224n and an upper impurity region 224p. In one embodiment, the lower impurity region 224n may be an N-type impurity region and the upper impurity region 224p may be a P-type impurity region.

The semiconductor pattern may further include a metal silicide layer 224s formed on the diode 225. The metal silicide layer 224s may lower a resistance at the boundary between the diode 225 and a subsequently formed heater electrode, thereby decreasing an operation current of the semiconductor device. In one embodiment, the metal silicide layer 224s is formed by depositing a metal layer having a high melting-point and reacting the semiconductor layer 224 with the metal layer. Any unreacted portion of the metal layer during the siliciding process may be removed in a strip process. The strip process may include, for example, a wet etch process. The metal silicide layer 224s may include a material such as, for example, cobalt silicide, tungsten silicide ($WSi_x$) or the like or a combination thereof. In one embodiment, the metal silicide layer 224s may be formed of cobalt silicide.

Figure 2I:
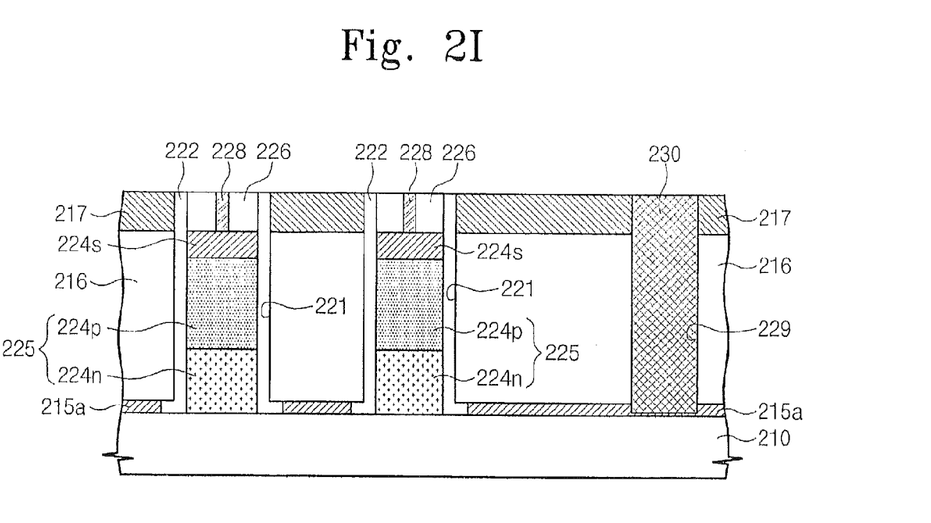

Referring to FIG. 2I, a heater electrode pattern is formed to substantially fill the opening 221 on the semiconductor pattern. The heater electrode pattern may include a heater electrode 228 and a heater electrode spacer 226 surrounding the heater electrode 228. The heater electrode spacer 226 may be formed by depositing a thermally insulative material layer within the opening 221 and on the semiconductor pattern. The thermally insulative material layer may then be anisotropically etched in a dry etch process. The heater electrode 228 may be formed by depositing a heater electrode material is formed to substantially fill the opening 221 where the heater electrode spacer 226 is formed. A patterning process may then be performed to form the heater electrode 228 with a narrowed cross section. In one embodiment, the patterning process may include a planarization process performed by means of a polishing process such as a CMP process. By forming the heater electrode 228 with a narrowed cross section, the resistance of the heater electrode 228 may be increased. During the planarization process for forming the heater electrode 228, the second silicon oxide layer 218 may be removed.

As exemplarily shown in FIG. 2I, the heater electrode 228 is connected to the diode 225 and serves to heat a phase change material layer formed in a subsequent process. The heater electrode 228 may include, for example, a metal nitride, a metal oxynitride, carbon (C), titanium (Ti), zirconium (Zr), tantalum (Ta), copper (Cu), tungsten (W), hafnium (Hf), molybdenum (Mo), aluminum (Al), aluminum titanium (AlTi), aluminum-copper alloy (Al—Cu), aluminum-copper-silicon ally (Al—Cu—Si), tungsten titanium (WTi), tungsten silicide ($WSi_x$), or the like or a combination thereof. The metal nitride may include, for example, titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), zirconium aluminum nitride (ZrAlN), tantalum silicon nitride (TaSiN), tantalum aluminum nitride (TaAlN), tungsten silicon nitride (WSiN), tungsten boron nitride (WBN), molybdenum silicon nitride (MoSiN), molybdenum aluminum nitride (MoAlN), or the like or a combination thereof. The metal oxynitride may include, for example, titanium oxynitride (TiON), titanium aluminum oxynitride (TiAlON), tantalum oxynitride (TaON), tungsten oxynitride (WON), or the like or a combination thereof. In one embodiment, the heater electrode 128 may be formed of titanium nitride.

The heater electrode spacer 226 may serve to narrow the cross sectional area of the heater electrode 228 as well as reduce the conduction of heat generated from the heater electrode 228. The heater electrode spacer 226 may include, for example, silicon oxide, silicon nitride, or the like or a combination thereof. In one embodiment, the heater electrode spacer 226 may be formed of the silicon nitride.

A contact hole 229 may be formed to be spaced apart from the opening 221 and to expose a portion of the conductive pattern 215a. A contact plug 230 is then formed to substantially fill the contact hole 229. A contact plug 230 is then formed to substantially fill the contact hole 229. The contact plug 230 may supply power to an interconnection formed to connect phase change random access memory cells in a predetermined direction. Accordingly, the interconnection may be a wordline connecting phase change random access memory cells, previously described with reference to FIG. 2A. Accordingly, the contact plug 230 may have resistance which is about 10 times lower than in a structure that is directly connected to an active region of the semiconductor substrate 210.

Figure 2J:
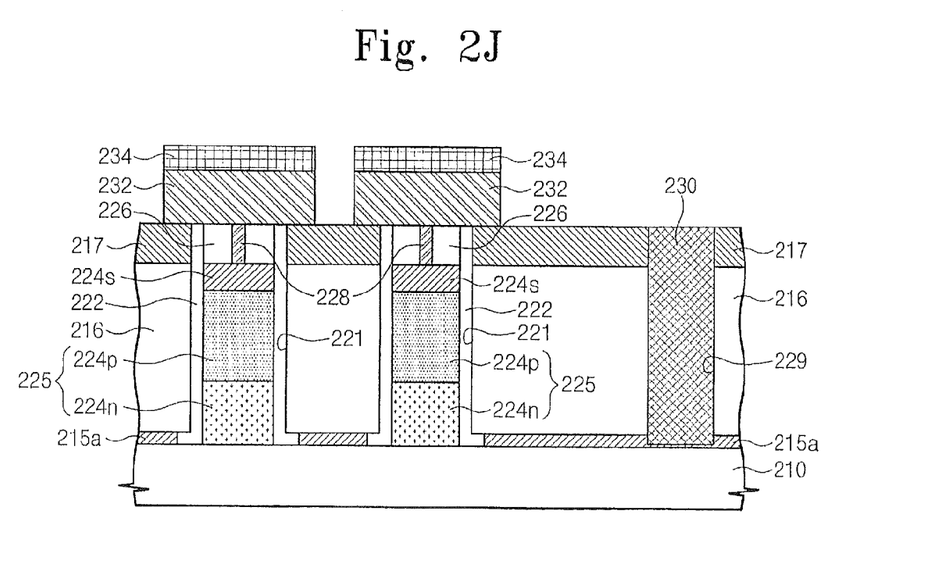

Referring to FIG. 2J, a phase change material layer 232 and a capping electrode 234 are sequentially formed on the resultant structure where the heater electrode 228 is formed. The phase change material layer 232 and the capping electrode 234 may be formed by depositing a phase change material and a capping electrode material and patterning the same.

The phase change material layer 232 may include a chalcogenide compound containing, for example, antimony (Sb), tellurium (Te), selenium (Se), or the like or a combination thereof. In one embodiment, the phase change material layer 232 may be formed of $Ge_{22}Sb_{22}Te_{56}$.

The capping electrode 234 may, for example, include a metal nitride, a metal oxynitride, carbon (C), titanium (Ti), zirconium (Zr), tantalum (Ta), copper (Cu), tungsten (W), hafnium (Hf), molybdenum (Mo), aluminum (Al), aluminum titanium (AlTi), aluminum-copper alloy (Al—Cu), aluminum-copper-silicon ally (Al—Cu—Si), tungsten titanium (WTi), tungsten silicide ($WSi_x$), or the like or a combination thereof. The metal nitride may, for example, include titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), zirconium aluminum nitride (ZrAlN), tantalum silicon nitride (TaSiN), tantalum aluminum nitride (TaAlN), tungsten silicon nitride (WSiN), tungsten boron nitride (WBN), molybdenum silicon nitride (MoSiN), molybdenum aluminum nitride (MoAlN), or the like or a combination thereof. The metal oxynitride may, for example, include titanium oxynitride (TiON), titanium aluminum oxynitride (TiAlON), tantalum oxynitride (TaON), tungsten oxynitride (WON), or the like or a combination thereof. In one embodiment, the capping electrode 234 may be formed of titanium nitride. A bitline (not shown) may be formed over the capping electrode 234.

According to the embodiments exemplarily described above, a metal silicide layer is provided on the entire surface of an active region of a semiconductor substrate except at a region corresponding to the location of a diode. Thus, a resistance of the active region can be at least five times lower than a resistance of an active region corresponding to an impurity region. As a result, an operation current of the semiconductor device (e.g., the phase change memory device) can be improved to achieve the superior operation characteristics and is applicable to high integration.

In addition, a metal silicide layer can also be connected to a contact plug. Thus, the contact resistance of the semiconductor device (e.g., a phase change memory device) can be about 10 times lower than a contact resistance of a structure that is directly connected to a semiconductor substrate. As a result, operation current of the semiconductor device (e.g., the phase change memory device) is improved to achieve superior operation characteristics and high integration.

Although embodiments have been exemplarily described in connection with the illustrated in the accompanying drawings, the embodiments are not limited to the description expressly provided herein. It will be apparent to those skilled in the art that various substitutions, modifications and changes may be made without departing from the scope and spirit of the invention.

What is claimed is:

1. A method for fabricating a semiconductor device, comprising:
   forming an active region in a semiconductor substrate;
   forming a conductive pattern on a predetermined region of the active region;
   forming an interlayer dielectric pattern on the conductive pattern, the interlayer dielectric pattern including an opening that exposes the predetermined region of the active region;
   forming a semiconductor pattern in the opening;
   forming a heater electrode pattern on the semiconductor pattern in the opening;
   forming a contact hole spaced apart from the opening, wherein the contact hole exposes the conductive pattern;
   forming a contact plug to substantially fill the contact hole; and
   forming a phase change material layer on the heater electrode pattern,
   wherein forming the conductive pattern and the interlayer dielectric pattern comprises:
      forming a silicide blocking layer over the predetermined region of the active region, the silicide blocking layer exposing a portion of the semiconductor substrate;
      forming a metal silicide pattern on the exposed portion of the semiconductor substrate;
      forming the interlayer dielectric pattern including the opening, wherein the opening exposes the silicide blocking pattern; and
      removing the silicide blocking pattern exposed by the opening.

2. The method as recited in claim 1, wherein the silicide blocking pattern includes silicon oxide, silicon nitride, silicon oxynitride, a low-k dielectric material or a combination thereof.

3. The method as recited in claim 1, wherein the silicide blocking pattern is removed during the formation of the interlayer dielectric pattern including the opening.

4. The method as recited in claim 1, further comprising forming a spacer on an inner sidewall of the opening.

5. The method as recited in claim 1, wherein forming the conductive pattern comprises:
   forming a conductive layer covering the predetermined region of the active region;
   forming the interlayer dielectric pattern including the opening, wherein the opening exposes the conductive layer over the predetermined region of the active region; and
   removing the conductive layer exposed by the opening.

6. The method as recited in claim 5, wherein removing the conductive layer includes wet etching the conductive layer using hydrofluoric acid (HF) as an etch solution.

7. The method as recited in claim 6, wherein the conductive layer includes metal silicide.

8. The method as recited in claim 1, wherein forming the semiconductor pattern and forming the heater electrode pattern comprises:
   forming a semiconductor layer within a lower portion of the opening;
   implanting impurity ions into the semiconductor layer to form the semiconductor pattern; and
   forming the heater electrode pattern on the semiconductor pattern, wherein the heater electrode pattern substantially fills the opening.

9. The method as recited in claim 8, wherein the semiconductor layer includes an epitaxially grown material, polysilicon, or a combination thereof.

10. The method as recited in claim 8, wherein the semiconductor pattern includes a diode.

11. The method as recited in claim 10, further comprising forming a metal silicide layer on the diode.

12. The method as recited in claim 8, wherein the heater electrode pattern includes a heater electrode and a heater electrode spacer surrounding the heater electrode.

* * * * *